United States Patent
Charnvanichborikarn et al.

(10) Patent No.: US 11,315,790 B2
(45) Date of Patent: Apr. 26, 2022

(54) ENHANCED SUBSTRATE AMORPHIZATION USING INTERMITTENT ION EXPOSURE

(71) Applicant: Applied Materials, Inc., Santa Clara, CA (US)

(72) Inventors: Supakit Charnvanichborikarn, Gloucester, MA (US); Christopher R. Hatem, Seabrook, NH (US)

(73) Assignee: Applied Materials, Inc., Santa Clara, CA (US)

( * ) Notice: Subject to any disclaimer, the term of this patent is extended or adjusted under 35 U.S.C. 154(b) by 95 days.

(21) Appl. No.: 16/660,417

(22) Filed: Oct. 22, 2019

(65) Prior Publication Data
US 2021/0118681 A1    Apr. 22, 2021

(51) Int. Cl.
| H01L 21/223 | (2006.01) |
| H01L 21/265 | (2006.01) |
| H01L 21/02 | (2006.01) |
| H01J 37/317 | (2006.01) |

(52) U.S. Cl.
CPC ...... *H01L 21/2236* (2013.01); *H01J 37/3171* (2013.01); *H01L 21/02658* (2013.01); *H01L 21/265* (2013.01)

(58) Field of Classification Search
CPC .............. H01L 21/2236; H01L 21/265; H01J 37/3171; H01J 37/32412
See application file for complete search history.

(56) References Cited

U.S. PATENT DOCUMENTS

| 6,352,909 B1 * | 3/2002 | Usenko .............. H01L 21/2236 438/458 |
| 7,687,787 B2 * | 3/2010 | Godet ................ H01J 37/32935 250/492.21 |
| 9,165,771 B2 * | 10/2015 | Ventzek ............. H01J 37/32449 |
| 10,840,080 B2 * | 11/2020 | Usenko ............. H01L 21/02318 |
| 2010/0112788 A1 * | 5/2010 | Ramappa .......... H01L 21/26506 438/473 |
| 2013/0049200 A1 | 2/2013 | Besser et al. |
| 2014/0272182 A1 * | 9/2014 | Koo ..................... H01J 37/3211 427/523 |
| 2017/0059997 A1 * | 3/2017 | Rupp ................. H01L 29/0615 |

FOREIGN PATENT DOCUMENTS

WO    2012154373 A2    11/2012

OTHER PUBLICATIONS

S. Qin, "Plasma Doping (PLAD) for Advanced Memory Device Manufacturing", Int. Conf. Ion Implantation (2014), 6 pages.
(Continued)

*Primary Examiner* — Michael M Trinh
(74) *Attorney, Agent, or Firm* — Kacvinsky Daisak Bluni PLLC

(57) ABSTRACT

A method may include providing a substrate in a plasma chamber, the substrate comprising a monocrystalline semiconductor, having an upper surface. The method may include initiating a plasma in the plasma chamber, the plasma comprising an amorphizing ion species, and applying a pulse routine to the substrate, the pulse routine comprising a plurality of extraction voltage pulses, wherein a plurality of ion pulses are directed to the substrate, and wherein an ion dose per pulse is greater than a threshold for low dose amorphization.

15 Claims, 3 Drawing Sheets

(56) References Cited

OTHER PUBLICATIONS

Myers, et al., "Pulsed Ion Beam Measurement of the Time Constant of Dynamic Annealing in Si," Phys. Rev. Lett, 109, 095502, Aug. 27, 2012.

Charnvanichborikarn, et al., "Pulsed ion beam measurement of defect diffusion lengths in irradiated solids," J Phys: Condens. Matter 25 (2-13) 162203, 4pp.

* cited by examiner

ENHANCED SUBSTRATE AMORPHIZATION USING INTERMITTENT ION EXPOSURE

BACKGROUND

Field

Embodiments relate to the field of semiconductor processing, an in particular, to pulsed plasma processing apparatus and techniques for processing semiconductor substrates.

Discussion of Related Art

Pre-amorphization implant (PAI) is a well-established technique that has frequently been used in semiconductor device fabrication processes. The PAI process employs energetic ions to completely disrupt crystal lattice structure of a crystalline substrate through inelastic electronic or nuclear collisions. Damage accumulation may be formed at approximately the depth of the maximum nuclear energy loss. Increasing ion dose may result in a formation of amorphous region and extension of the amorphous region toward the given substrate surface.

Notably, PAI is often used in conjunction with an additional ion implantation process, in order to better control the placement of ions within a substrate during the additional ion implantation process. For example, a PAI implant may be performed before a doping implant that is used to introduce a dopant species into a semiconductor substrate, such as silicon, silicon: germanium alloy, or other known monocrystalline semiconductor. The PAI implant generates an amorphous layer in a previously monocrystalline region of a substrate. This amorphous layer can effectively suppress channeling of subsequently implanted dopant ions, resulting in a more controlled and predictable dopant profile. In addition to using pre-amorphized layers for dechanneling dopant implantation, PAI may be used to improve re-crystallization and electrical activation during thermal annealing, or for precision material engineering applications (e.g., line edge roughness reduction, structural defect repair).

Beamline ion implanters are generally used to perform PAI processes, where control of ion energy and ion dose is well established. Notably, many PAI recipes may call for ion doses ranging from 5E14/cm2 up to 1E16/cm2, depending on implant conditions and amorphized materials. Side effects of the high dose implantation include significant sputtering and swelling of the substrate and modification of substrate composition. In some cases, forming an amorphous oxide layer over the substrate may be used to reduce the channeling effects in the PAI implant species, while resulting in additional process steps for formation of the oxide layer and possible contamination of oxygen from the oxide layer into the underlying matrix due to ion beam mixing.

Cryogenic implantation approaches have also been employed for PAI implants, using wafers (substrates) cooled to −100° C. to generate a sharper amorphous/crystalline boundary in a substrate, and reduce end-of-range damage, with the cost of substantially lower wafer throughput.

With respect to these and other considerations, the present disclosure is provided.

BRIEF SUMMARY

In one embodiment, a method is provided. The method may include providing a substrate in a plasma chamber, the substrate comprising a monocrystalline semiconductor, having an upper surface. The method may include initiating a plasma in the plasma chamber, the plasma comprising an amorphizing ion species, and applying a pulse routine to the substrate when the plasma is present in the plasma chamber, the pulse routine comprising a plurality of extraction voltage pulses, wherein a plurality of ion pulses are directed to the substrate, and wherein an ion dose per pulse is greater than a threshold for low dose amorphization.

In another embodiment, a method may include retrieving a threshold for low dose amorphization for amorphizing a substrate type with an ion species, where the threshold constitutes an ion dose per pulse of the ion species. The method may include providing a substrate in a plasma chamber, the substrate comprising a monocrystalline material corresponding to the substrate type, and having an upper surface. The method may also include initiating a plasma in the plasma chamber, where the plasma includes the ion species. The method may also include applying a pulse routine to the substrate when the plasma is present in the plasma chamber, where the pulse routine comprises a plurality of extraction voltage pulses, wherein a plurality of ion pulses are directed to the substrate, wherein an ion dose per pulse is greater than the threshold for low dose amorphization.

In a further embodiment, a method includes providing a crystalline substrate in a plasma chamber; and initiating a plasma in the plasma chamber, the plasma comprising an ion species. The method may further include tuning a degree of amorphization of the crystalline substrate by performing a plurality of implantation exposures. As such a given implant exposure may involve applying a pulse routine to the crystalline substrate when the plasma is present in the plasma chamber, the pulse routine comprising a plurality of extraction voltage pulses, where a plurality of ion pulses are directed to the substrate. As such, over the plurality of implantation exposures a total implant dose may be maintained constant while a dose per pulse is varied.

DESCRIPTION OF EMBODIMENTS

Figure 1:
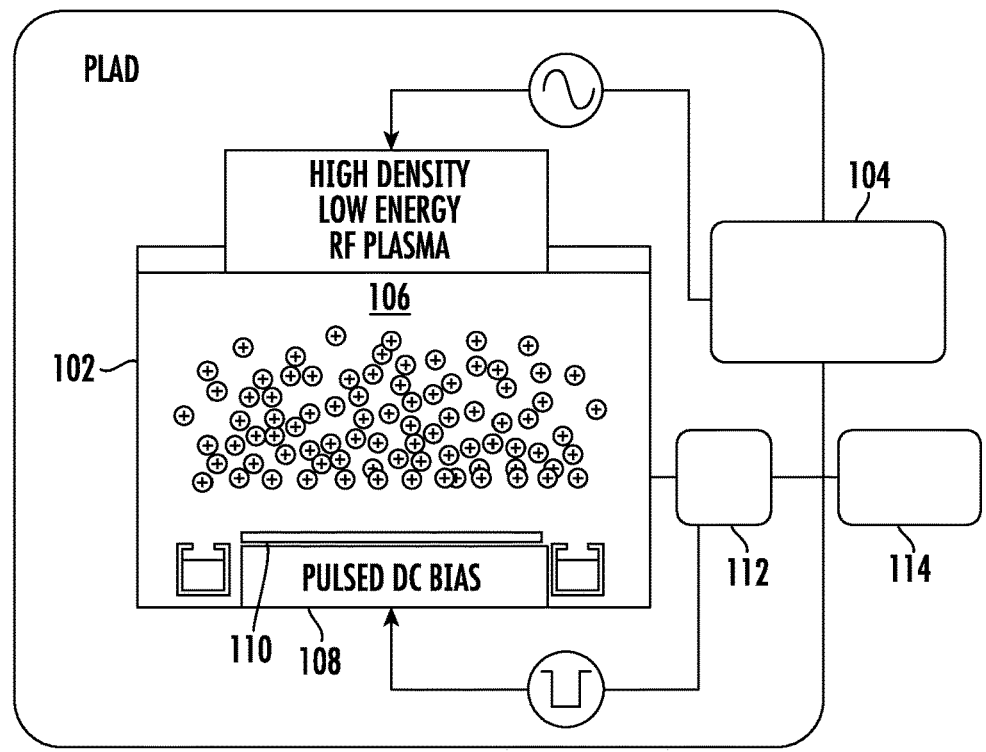
FIG. 1 shows a processing apparatus according to various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments provide approaches for generating an amorphous layer in a substrate, where the substrate may be a monocrystalline semiconductor, a polycrystalline semiconductor, a monocrystalline metal, a polycrystalline metal, a monocrystalline ceramic, polycrystalline ceramic, monocrystalline oxide, polycrystalline oxide, or any other suitable crystalline material. In some embodiments, these approaches may be suitable for use in conjunction with semiconductor doping, where the doping takes place by ion implantation into the substrate. In other embodiments, an amorphization layer may be generated at low total ion dose for any suitable use of an amorphous layer, including to aid in surface dose retention and silicidation processes.

In some embodiments, PAI processes are conducted in a plasma immersion tool, where a substrate is situated within a plasma chamber and directly exposed to a plasma. By biasing a substrate with respect to the plasma, ions may be extracted from the plasma at a given ion energy that is determined by the voltage difference between plasma and substrate. By way of reference, plasma immersion systems have been used for ion implantation of dopants into substrates. To accomplish ion implantation, pulse biasing of a substrate with respect to the plasma is often used, instead of DC biasing, because pulse biasing creates less damage during the pulse ON period. In addition, pulse biasing provides for neutralization of unwanted charges that may accumulate on a substrate in the afterglow period (i.e. after the pulse has ended). In the case of pulsed biasing, in known approaches, the $T_{ON}$ time of the pulse may be in the range of milliseconds or microseconds, such as 20-40 µs, with a duty cycle often less than 10%, such as 1-5%. A total ion dose need for a given application is therefore delivered by repeating the microsecond pulses for a sufficient number of times to generate the total dose. By keeping duty cycle relatively low, more time is provided in between pulses for charge neutralization. In addition, plasma immersion tools may generate relatively high ion density, where processing of substrates may be rapid, even at low duty cycles of less than 10%.

FIG. 1 shows a processing apparatus according to various embodiments of the disclosure. The processing apparatus 100 may include a plasma chamber 102, where the plasma chamber 102 may be generally configured as in known plasma immersion implantation or PLAD apparatus. Further details of the plasma chamber 102 are therefore omitted. The processing apparatus 100 may include a power source 104, such as an RF power source to deliver radio frequency excitation to generate a plasma 106, when gaseous species are delivered into the plasma chamber. For example, the power source 104 may be an RF powered inductively coupled power source to generate an inductively coupled plasma, as known in the art. Gaseous species may be delivered from one or more gas sources (not separately shown) to generate ions of any suitable species, such as neon, carbon, nitrogen, oxygen, argon, to name just a few non-limiting examples of ion species.

The processing apparatus 100 may further include a substrate platen 108, to support a substrate 110, where an upper surface of the substrate 110 is exposed to the plasma 106, as in known PLAD apparatus. The processing apparatus 100 may further include a bias voltage supply 112 to generate a bias voltage between the substrate 110 and the plasma chamber 102. As such, when the bias voltage supply 112 generates a voltage between the plasma chamber 102 and the substrate 110, a similar, but slightly larger, voltage difference is generated between the plasma 106 and substrate 110. For example, a 5000 (5 kV) voltage difference established between the plasma chamber 102 and the substrate 110 (or, equivalently, the substrate platen 108) may generate a voltage difference of approximately 5005 V to 5030 V between the plasma 106 and substrate 110. For purposes of the discussion herein, the voltage referred to will denote the voltage applied between plasma chamber and substrate.

In some embodiments, the bias voltage supply 112 may generate a bias voltage as a pulsed voltage signal, wherein the pulsed voltage signal is applied in a repetitive and regular manner, to generate a pulse routine comprising a plurality of extraction voltage pulses. For example, a pulse routine may apply voltage pulses of 500 V magnitude, 1000 V magnitude, 2000 V magnitude, 5000 V magnitude, or 10,000 V magnitude in various non-limiting embodiments. In various embodiments, the pulse routine may be characterized by a pulsing period ($t_{on}+t_{off}$), meaning a duration between beginning of a first voltage pulse and a beginning of a next voltage pulse, immediately after the first voltage pulse, where the pulsing period may be held constant over the duration of application of the pulse routine. The pulse routine may also be characterized by a pulse duration ($t_{on}$), meaning a duration when a voltage difference is applied between the substrate 110 and plasma chamber 102, within any given pulsing period. Thus, the pulse duration will be less than the pulse period. As such, the pulse routine may also be characterized by a duty cycle, where the duty cycle is simply the ratio of pulse duration to pulsing period.

The processing apparatus 100 may further include a controller 114, to control the pulsing routine applied to the substrate 110, in order to amorphize the substrate 110, as discussed herein below.

According to various embodiments of the disclosure, a plasma 106 may be initiated in the plasma chamber 102, where the plasma 106 may be formed at least in part of ions that constitute an amorphizing species. As noted, the amorphizing species may be any suitable ion capable of amorphizing an initially crystalline region of materials, such as substrate 110. In various non-limiting embodiments such suitable ions may include an inert gas ion, silicon, carbon, nitrogen, oxygen, metal, or other species. When the plasma 106 is present in the plasma chamber 102, the controller 114 may generate a signal for the bias voltage supply 112 to apply a pulse routine to the substrate 110, where the pulse routine constitutes a plurality of extraction voltage pulses, meaning voltage pulses that generate a bias voltage between the substrate 110 and plasma 106. As such, when the extraction voltage pulses are applied between the substrate 110 and plasma 106, ions are extracted in pulsed form from the plasma 106, generating a plurality of ion pulses that are directed to the substrate. In other words, during an ON period ($t_{on}$), corresponding to the duration of an extraction voltage pulse, an ion pulse is extracted from the plasma 106 and directed to the substrate 110. For example, the extraction voltage pulses may apply a −1000 V bias of the substrate 110 with respect to the plasma chamber 102 during an ON period of the pulsing period, so that singly charged positive ions are extracted from the plasma and accelerated to an energy of slightly more than 1000 V when striking the substrate 110. During an OFF portion of the pulsing period ($t_{off}$), no bias is established between the plasma chamber 102 and substrate 110, so the potential of the plasma 106 may generally be just a few volts or a few tens of volts higher than the potential of the substrate.

Figure 2:
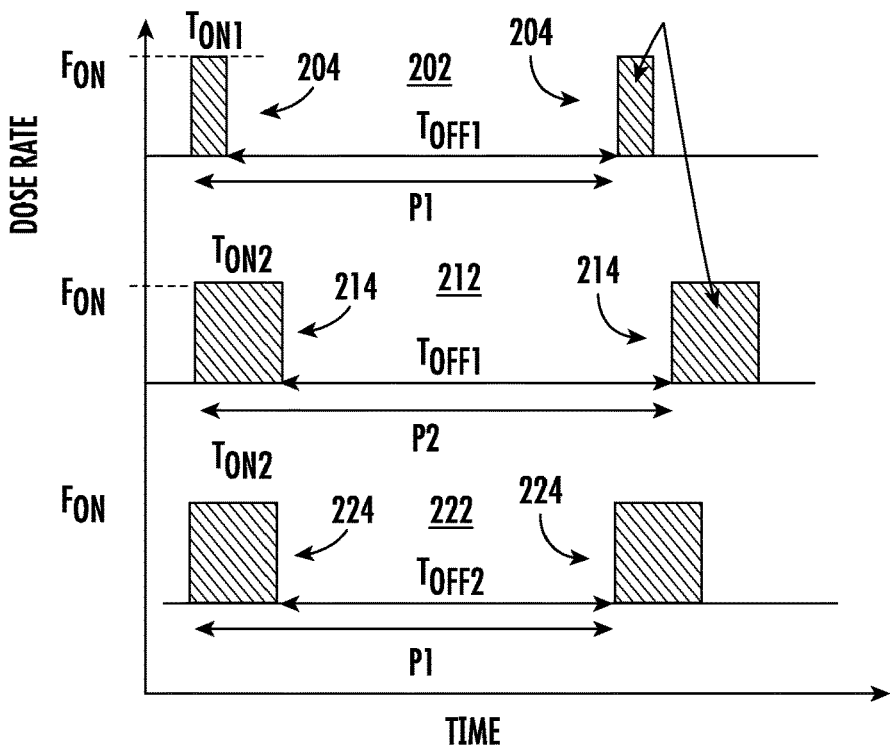
FIG. 2 shows different ion pulse routines available from the apparatus of FIG. 1.

FIG. 2 shows a non-limiting set of three different exemplary ion pulse routines available from the apparatus of FIG. 1. Here, a time dependence of dose rate or ion flux ($F_{on}$) is used to illustrate a pulse train. A pulse routine is characterized by $F_{on}$, $t_{on}$, and $t_{off}$, which parameters are independently controlled by the controller 114 and are kept constant throughout the process. Thus, the total ion dose per pulse (DPP) is equal to a product expressed as $t_{on}*F_{on}$, where the unit of $F_{on}$ may be ion/cm$^2$-s and unit of $t_{on}$ may be in second. In the pulse routine 202, ion pulses 204 are characterized by a $t_{on1}$, and $t_{off1}$, and a pulsing period P1. In the pulse routine 212, ion pulses 214 are characterized by a $t_{on2}$, and $t_{off1}$, and a pulsing period P2, which is greater than P1 due to the fact that $t_{on2}$ is greater than $t_{on1}$. In the pulse routine 222, ion pulses 224 are characterized by a $t_{on2}$, and $t_{off2}$, and a pulsing period P1, which results from the fact that $t_{off2}$ is less than $t_{off1}$ $t_{on1}$ by the same amount that $t_{on2}$ exceeds $t_{on1}$.

In accordance with various embodiments of the disclosure, a suitable ion pulse routine may be applied to implant a sufficient total ion dose into a crystalline material to achieve amorphization. The thickness of the amorphous layer may in part be determined by the substrate type, ion species energy, dose, and substrate temperature.

In additional to the common process parameters described above, the present inventors have discovered a novel approach where adjusting the DPP may be used to modify damage accumulation rate, which results in different disorder levels and consequently leads to different amorphous layer thicknesses.

Figure 3:
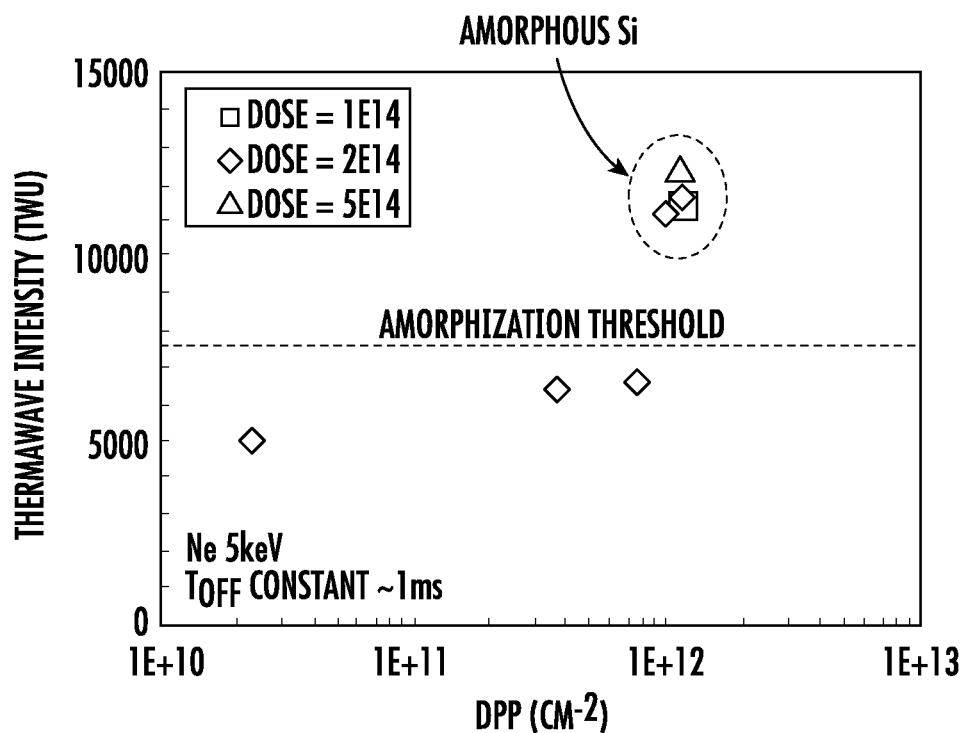
FIG. 3 illustrates experimental results, showing amorphization behavior of a crystalline silicon layer, as a function of ion dose per pulse (DPP) for different total ion doses.

FIG. 3 presents a graph that illustrates experimental results, where 5 keV Ne ions are pulsed implanted into crystalline silicon with different values of DPP, where the different values are generated by varying $t_{on}$, while keeping $F_{on}$ and $t_{off}$ constant. The amount of crystalline damage is quantified by Thermawave, which approach is a standard technique used in semiconductor industry to monitor the ion implantation process. For a given implant species, energy the Thermawave intensity is dependent on dose. For a given implant species, energy, and dose (within the range of consideration), The Thermawave intensity increases with increasing DPP, which increase may be correlated with increased lattice damage, which damage is an indication of increased amorphization in the crystalline silicon.

The various data points of FIG. 3 are shown as signal intensity a function of DPP on the X-axis, where DPP has been discussed above. The diamond symbols correspond to a total implanted ion dose of 2E14/cm$^2$, the triangle symbol to 5E14/cm$^2$, and the square corresponds to 1E14/cm$^2$. For all samples, the $t_{off}$ of the pulse routine is kept constant to ~1 ms while the DPP is dependent on $F_{on}$ and $t_{on}$. Considering just the data for total implanted ion dose of 2E14/cm$^2$, the different data points correspond to variations in the ion dose per pulse over a nearly two order of magnitude range. At a moderate dose per pulse level of ~2.3E10/cm$^2$ the silicon substrate generates a Thermawave signal level of ~5000 TWU after a total ion dose of 2E14/cm$^2$ is implanted into the silicon substrate. In other words, a total of approximately 10,000 ion pulses of ~2.3E10/cm$^2$ per pulse are applied to generate the total implanted ion dose of 2E14/cm$^2$ into the silicon substrate. Other measurements including electron microscopy have been conducted to confirm that the increased Thermawave intensity corresponds to increased lattice damage. Based upon the other measurements for silicon implanted with this particular ion species, energy, dose, and measurement system, a Thermawave intensity greater than ~7500 TWU is deemed to indicate amorphization. Thus, the resulting signal of ~5000 TWU suggests that the implanted silicon substrate remains crystalline under these implantation conditions of ~2.3E10/cm$^2$ per pulse applied to generate the total implanted ion dose of 2E14/cm$^2$.

At a more than 10 times stronger dose per pulse level of ~3.7E11/cm$^2$ the silicon substrate generates a Thermawave signal level of ~6300 TWU after a total ion dose of 2E14/cm$^2$ is implanted into the silicon substrate. In other words, a total of approximately 540 ion pulses are applied at ~3.7E11/cm$^2$ ion dose per pulse, to generate the same total implanted ion dose of 2E14/cm$^2$ into the silicon substrate. The value of ~6300 TWU indicates that total amount of disorder increases and a partial amorphization of a layer near the surface of the silicon substrate may have taken place.

At a still stronger dose per pulse level of ~7.6E11/cm$^2$ the silicon substrate generates a Thermawave signal level of 6500 after a total ion dose of 2E14/cm$^2$ is implanted into the silicon substrate. In other words, a total of approximately 260 ion pulses are applied at 7.6E11/cm$^2$ ion dose per pulse, to generate the same total implanted ion dose of 2E14/cm$^2$ into the silicon substrate. The value of ~6600 indicates that total amount of disorder further increases and a partial amorphization of a layer near the surface of the silicon substrate may have taken place, slightly more than the amorphization at 3.7E11/cm$^2$.

Advantageously, the results shown for DPP values in the range of ~2E10/cm$^2$ to ~8E11/cm$^2$ shows that, for a given total ion dose (2E14/cm$^2$) the degree of amorphization or related substrate damage may be tuned by controlling the pulse routine (i.e., varying the chosen DPP) to be applied in a pulsed implantation procedure. Thus, a relatively greater or lesser damage may be generated by increasing or decreasing DPP. Thus, a user may select a degree of amorphization to be achieved at a given total ion dose and may carefully control the amorphization by varying DPP, until the targeted result is achieved. In one example, the degree of amorphization of a semiconductor substrate may be tuned by performing a plurality of implantation exposures, where a given implant exposure entails applying a pulse routine to the semiconductor substrate, where the total implant dose is maintained constant, while DPP are varied over the plurality of implantation exposures.

As further shown in FIG. 3, when the DPP is increased by just about 30% to a stronger dose per pulse level of ~9.8E11/cm$^2$ the intensity of the Thermawave signal increases dramatically to ~11000 after a total ion dose of 2E14/cm$^2$ is implanted into the silicon substrate. In other words, a total of approximately 204 ion pulses are applied at ~9.8E11/cm$^2$ ion dose per pulse, to generate the same total implanted ion dose of 2E14/cm$^2$ into the silicon substrate. The value of ~11000 indicates that the total amount of disorder significantly increases and a complete amorphization of a layer near the surface of the silicon substrate may have taken place.

When the DPP is increased by another 15% to a stronger dose per pulse level of ~1.1E12/cm$^2$ the intensity of the Thermawave signal increases just slightly after a total ion dose of $2E14/cm^2$ is implanted into the silicon substrate. In other words, a total of approximately 175 ion pulses are applied at ~$1.1E12/cm^2$ ion dose per pulse, to generate the same total implanted ion dose of $2E14/cm^2$ into the silicon substrate. The value of ~11000 indicates that the total amount of disorder significantly increases and a complete amorphization of a layer near the surface of the silicon substrate may have taken place. For example, an upper region or upper layer of a substrate may be considered to be completely amorphized when amorphous material extends throughout the depth of the upper region, all the way to the upper surface of the substrate. Thus, amorphous material will extend from the upper surface of the substrate to a predetermined depth from the upper surface, that defined the lower bounds of the upper region that is completely amorphized.

A key observation from the results of the series of implants performed to a total ion dose of $2E14/cm^2$ is that the degree of amorphization strongly changes when DPP is increased above a given value, near $1E12/cm^2$.

Notably, the total Ne dose of $2E14/cm^2$ is relatively low compared with known ion doses used to amorphized silicon layers, that may use up to ~$1E15$ Ne/$cm^2$ to amorphize a given layer. Thus, by increasing the DPP to a relatively very large value, the total minimum ion dose for amorphization may be dramatically reduced.

Turning to the other data shown in FIG. 3, there are two other results shown for very high DPP where the total ion dose is varied. At a total ion dose per pulse level of ~$1.1E12/cm^2$ the silicon substrate generates a Thermawave signal of ~12000 TWU after a total ion dose of $5E14/cm^2$ is implanted into the silicon substrate. In other words, a total of approximately 450 ion pulses are applied at ~$1.1E12/cm^2$ ion dose per pulse, to generate the total implanted ion dose of $5E14/cm^2$ into the silicon substrate. The resulting signal of ~12000 TWU suggests that the implanted silicon substrate may be completely amorphized under these implantation conditions.

At a total ion dose per pulse level of ~$1.2E12/cm^2$ the silicon substrate generates a Thermawave signal level of ~11000 TWU after a total ion dose of $1E14/cm^2$ is implanted into the silicon substrate. In other words, a total of approximately 85 ion pulses are applied at ~$1.2E12/cm^2$ ion dose per pulse, to generate the total implanted ion dose of $1E14/cm^2$ into the silicon substrate. The resulting signal of ~11000 TWU suggests that the implanted silicon substrate contains significant amount of disorder and may be completely amorphized under these implantation conditions.

While the above results show that under the specific implant parameters used (ion type, ion energy, substrate) a DPP higher than ~$1E12/cm^2$ is sufficient to produce a relatively thick amorphous layer, a specific DPP threshold value to effectively form an amorphous layer is dependent on several other parameters but is not limited to substrate type, ion species, energy, dose, and $t_{off}$ time. Notably, and more generally, the amount of lattice damage induced by pulsed plasma implantation can be effectively engineered by tuning the pulse routine, which tuning facilitates changing the degree of damage, such as amorphization, without changing the total implanted dose.

Unlike beamline ion implanters, where $F_{on}$ can be well defined by simply dialing beam current, controlling $F_{on}$ in PLAD or similar apparatus is not practically straightforward and is dependent on several other conditions but not limited to gas species, gas flow rate, and plasma power. Tuning a pulse routine via control of $F_{on}$, $t_{on}$, and $t_{off}$ parameters provides an additional control for PLAD or similar apparatus to tailor damage in implanted materials. Without limitation as to any particular theory, the increased amorphization generated by high DPP pulse routines of the present embodiments may be related to the amount of stable disorder generated during implantation. During a pulsed implantation process, point defects generated by implanting ions may experience dynamic annealing and annihilate or evolve to form more stable defects during the $t_{off}$ time. Because defects generated in a given pulse may interact with those defects generated in a subsequent pulse, increasing $t_{off}$ time reduces the possibility of inter-pulse defect interaction, and is expected to decrease overall defect concentration. By increasing the DPP, the ion density within a pulse increases, resulting in a shorter average lateral distance between collision cascades. Such a pulsed implant condition promotes inter-cascade defect interactions, allowing more stable defects to form. Notably, materials such as silicon may have what is termed a characteristic defect lifetime for defects generated by ion implantation. Previous studies have shown silicon to exhibit a characteristic defect lifetime on the order of several milliseconds (ms), such as between 5 ms and 10 ms. In accordance with various embodiments, the pulse period duration, and more particularly, the on time $t_{on}$ may be set to a duration of less than or equal to the characteristic defect lifetime, so a majority of active defects may persist between one pulse to another.

Figure 4:
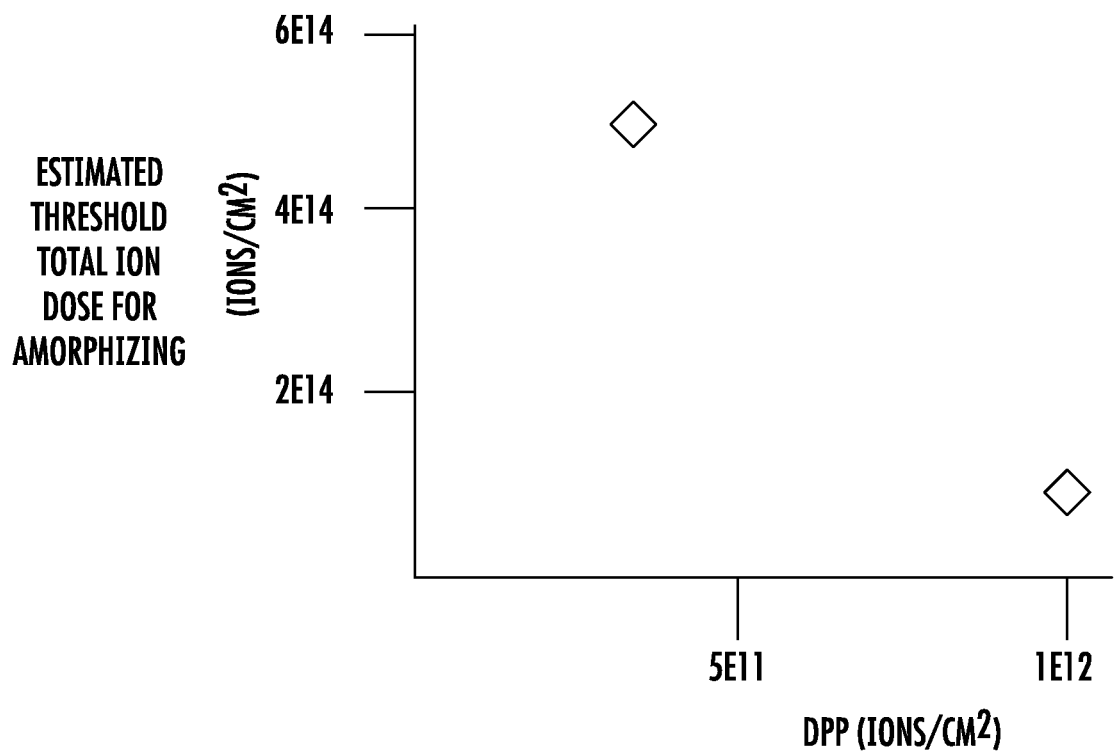
FIG. 4 presents experimental results showing total ion dose for amorphization for silicon implanted with 5 keV neon ions, as a function of DPP.

While the above results indicate that above a threshold DPP value amorphization is improved at a given total ion dose, another advantage of employing a high DPP is the ability to amorphize a given layer or region of a substrate at a relatively lower total ion dose. FIG. 4 presents experimental results showing an estimate of the total ion dose needed for amorphization for silicon implanted with 5 keV Ne ions, as a function of DPP, based on the above results. The total ion dose represents an estimated threshold or minimum value of total ion dose needed to amorphize a given amount of a silicon substrate as a function of DPP. At a DPP of approximately $4E11/cm^2$ or less, the estimated threshold for amorphization is a total ion dose of $5E14/cm^2$, while at a DPP of ~$1E12/cm^2$ the estimated threshold for amorphization is at most a total ion dose of $1E14/cm^2$. Thus, for 5 keV Ne implantation into silicon, the DPP value of ~$1E12/cm^2$ may be said to constitute a threshold value for low dose amorphization. In other words, once the dose per pulse exceeds $1E12/cm^2$, the total ion dose required for amorphization drops substantially, in this case by a factor of approximately 5. In this sense, operating at DPP at or above $1E12/cm^2$ may be said to operate in the low amorphization dose regime, while below this DPP implantation operates in the high amorphization dose regime.

Moreover, the results of FIG. 3 and FIG. 4 may be at least partially due to the limitation of $t_{on}$ to a duration of less than the characteristic lifetime for defects, such as limiting $t_{on}$ to less than a few milliseconds in the case of implantation into silicon, using an inert gas ion or similar species. Said differently, the tuning of amorphization or related implant damage for a given total ion dose, may be varied by changing the pulse routine. Keeping $t_{on}$ to a duration of less than the characteristic lifetime of defects prevents defect generation and relaxation to happen at the same time, hence providing better control on implant damage. If $t_{on}$ is greater than the characteristic defect lifetime, some defects generated at the beginning of the pulse will completely relax (i.e., die off or no longer active) before the pulse duration ends, making defect engineering more complicated to control. Notably, arranging the pulsing period to be less than the characteristic defect lifetime will ensure that $t_{on}$ is also less than the characteristic defect lifetime, since $t_{on}$ is by definition of less duration than the pulsing period. Thus, when the pulsing period is set to less than the characteristic defect lifetime, the duration of $t_{on}$ will not be long enough for defects created at the beginning of the pulse to relax.

As noted, the approach for using a high DPP ion pulse routine to achieve low dose amorphization may be employed for any suitable ion species, ion energy, as well as substrate type. In some embodiments, the threshold value of DPP to achieve low dose amorphization may be predetermined experimentally for a given set of experimental conditions, such as substrate type, ion species, and ion energy, etc., following procedures similar to those outlined with respect to the above mentioned figures, for example. Once a threshold value of DPP is determined for a given set of experimental conditions for a given substrate type, the controller 114 may use the threshold DPP to generate a suitable pulse routine to apply to the processing apparatus 100 for processing a substrate of the given substrate type using a low overall total ion dose. Notably, the threshold value of DPP may be achieved by a suitable combination of pulse duration, as well as plasma density, from which parameters, the DPP may be readily calculated.

While the aforementioned embodiments focus on the use of a plasma immersion apparatus for high DPP implantation, the present approaches are not limited to PLAD tools, and may be applied to other known apparatus that have a plasma source capable of being pulsed. In addition, the exact regime of DPP where increased DPP will have a pronounced effect on increasing amorphization, such as a threshold for low dose amorphization, will vary with crystalline material type, amorphizing ion species, ion energy, among other factors.

More generally, the parameter of DPP may be recast as a dose per ion exposure, where the ion exposure may be provided by any suitable apparatus and process for providing a substrate with intermittent ion exposure. Thus, other pulsed plasma sources may provide intermittent ion exposure over a portion of a substrate or over a whole substrate.

Figure 5:
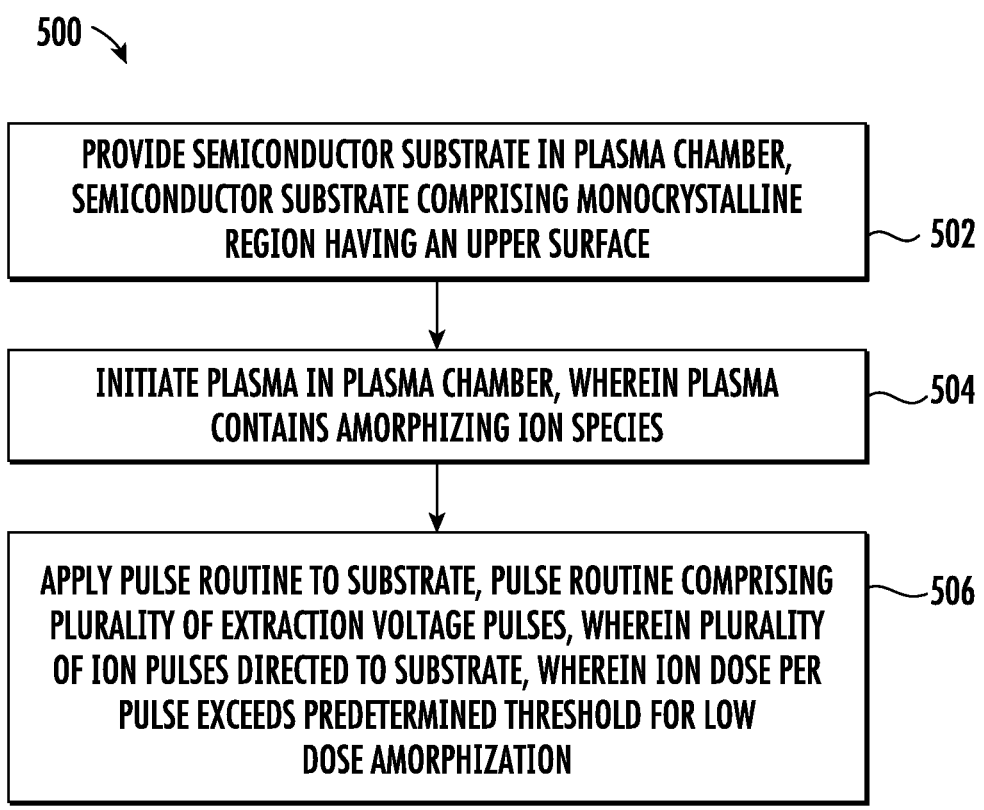
FIG. 5 depicts an exemplary process flow.

FIG. 5 depicts an exemplary process flow 500. At block 502, a crystalline substrate is provided in a plasma chamber. In some non-limiting embodiments, the crystalline substrate may be a monocrystalline semiconductor substrate, such as silicon, silicon-germanium alloy, or other known semiconductor material. The crystalline substrate may in particular include a monocrystalline region having an upper surface.

At block 504, a plasma is initiated in the plasma chamber. The plasma may contain an amorphizing species suitable for amorphizing at least a portion of the semiconductor substrate when implanted therein.

At block 506 a pulse routine is applied to the substrate. The pulse routine may include a plurality of extraction voltage pulses where a bias voltage is applied between the substrate and the plasma chamber to extract ions from the plasma and to impinge upon the substrate. As such, a plurality of ion pulses are directed to the substrate. The plurality of ion pulses may be arranged wherein the ion dose per pulse exceeds a predetermined threshold for low dose amorphization.

In summary, the present embodiments provide at least the following advantages. A first advantage is the amount of amorphization or related damage for a given total ion dose may be tuned by adjusting the DPP. In one aspect, this control can have the benefit of controlling the degree of amorphization or related damage for a given total ion dose, by varying DPP as well as maintaining $T_{off}$ below a given threshold. In another aspect, this control can also have benefit on the increased productivity for PAI processing of substrates, because the pre-amorphizing process may be performed at room temperature with a relatively lower total ion dose required for each substrate, due to the increased DPP applied. An additional advantage is the ability to form an amorphous layer having a targeted thickness, with limited sputtering and swelling because of the overall low total implant dose. The approaches of the present embodiments also provide additional process control to engineer implantation damage especially for PLAD or similar pulsed plasma-based apparatus. This ability is especially useful when capabilities to scan a wafer/beam and/or modify ion beam profile are unavailable. Another advantage of using the high DPP plasma immersion implantation approach of the present embodiments is the high degree of parallelism of ions extracted from a plasma immersion ion implant apparatus, better than the parallelism of ions extracted from a beamline implanter, thus providing more precise control of a PAI process, particularly on structured wafers.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A method, comprising:
providing a substrate in a plasma chamber, the substrate comprising a monocrystalline semiconductor, having an upper surface;
initiating a plasma in the plasma chamber, the plasma comprising an amorphizing ion species; and
applying a pulse routine to the substrate when the plasma is present in the plasma chamber, the pulse routine comprising a plurality of extraction voltage pulses, wherein a plurality of ion pulses are directed to the substrate,
wherein an ion dose per pulse is greater than a threshold for low dose amorphization.

2. The method of claim 1, wherein for a fixed total ion dose, and a fixed pulsing period,
an upper region of the substrate is completely amorphized when the ion dose per pulse exceeds the threshold, and
wherein the upper region is not completely amorphized when the ion dose per pulse is below the threshold.

3. The method of claim 1, wherein the pulse routine comprises a pulsing period, the pulsing period having a duration of a characteristic defect lifetime for defects generated by the plurality of ion pulses in the substrate, or less.

4. The method of claim 3, wherein the pulse routine comprises a pulse duration, the pulse duration being 5 microseconds to 1000 microseconds.

5. The method of claim 1, wherein the amorphizing ion species comprises Ne, wherein an extraction voltage of the extraction voltage pulses comprises a value of 5 keV, and wherein the threshold comprises a dose per pulse of $\sim 1E12/cm^2$.

6. The method of claim 5, wherein the plurality of extraction voltage pulses comprises a total ion dose, wherein the total ion dose is $1E14/cm^2$ or greater.

7. The method of claim 1, wherein when a first total ion dose is implanted into the substrate, an upper region of the substrate, extending to a predetermined depth from an upper surface of the substrate, is completely amorphized when the ion dose per pulse exceeds the threshold, and wherein the upper region is not completely amorphized when the ion dose per pulse is below the threshold when the first total ion dose is implanted into the substrate.

8. A method, comprising:

retrieving a threshold for low dose amorphization for amorphizing a substrate type with an ion species, the threshold comprising an ion dose per pulse of the ion species;

providing a substrate in a plasma chamber, the substrate comprising a monocrystalline material corresponding to the substrate type, and having an upper surface;

initiating a plasma in the plasma chamber, the plasma comprising the ion species; and applying a pulse routine to the substrate when the plasma is present in the plasma chamber, the pulse routine comprising a plurality of extraction voltage pulses, wherein a plurality of ion pulses are directed to the substrate, wherein an ion dose per pulse is greater than the threshold for low dose amorphization.

9. The method of claim 8, wherein the substrate is a first substrate, and wherein the threshold for low dose amorphization is determined by:

performing a plurality of implants into a second substrate, comprising the substrate type, wherein ion dose per pulse is varied among the plurality of implants, while total ion dose of the ion species is constant, wherein:

a first implant of the plurality of implants, comprising a first dose per pulse generates a first amorphous layer thickness, and a second implant of the plurality of implants, comprising a second dose per pulse generates a second amorphous layer thickness, greater than the first amorphous layer thickness.

10. The method of claim 8, wherein for a fixed total ion dose, and a fixed pulsing period, an upper region of the substrate is completely amorphized when the ion dose per pulse exceeds the threshold, and wherein the upper region is not completely amorphized when the ion dose per pulse is below the threshold.

11. The method of claim 8, wherein the pulse routine comprises a pulsing period, the pulsing period having a duration of a characteristic defect lifetime for defects generated by the plurality of ion pulses in the substrate or less.

12. The method of claim 11, wherein the pulse routine comprises a pulse duration, the pulse duration being 5 microseconds to 1000 microseconds.

13. The method of claim 8, wherein the ion species comprises neon, wherein the extraction voltage comprises a value of 5 KeV, and wherein the threshold comprises a dose per pulse of $1E12/cm^2$.

14. The method of claim 13, wherein the plurality of extraction voltage pulses comprises a total ion dose, wherein the total ion dose is $1E14/cm^2$ or greater.

15. The method of claim 8, wherein when a first total ion dose is implanted into the substrate, an upper region of the substrate, extending to a predetermined depth from an upper surface of the substrate, is completely amorphized when the ion dose per pulse exceeds the threshold, and wherein the upper region is not completely amorphized when the ion dose per pulse is below the threshold when the first total ion dose is implanted into the substrate.

* * * * *